(12) United States Patent
Fang et al.

(10) Patent No.: US 10,921,380 B2
(45) Date of Patent: Feb. 16, 2021

(54) METHOD FOR MEASURING THE INTERNAL RESISTANCE OF BATTERIES

(71) Applicant: MICROVAST POWER SYSTEMS CO., LTD., Huzhou (CN)

(72) Inventors: Weifeng Fang, Huzhou (CN); Xuezhong Dong, Huzhou (CN); Qiru Li, Huzhou (CN); Po Gao, Huzhou (CN); Wenjuan Liu Mattis, Huzhou (CN)

(73) Assignee: MICROVAST POWER SYSTEMS CO., LTD., Huzhou (CN)

( * ) Notice: Subject to any disclaimer, the term of this patent is extended or adjusted under 35 U.S.C. 154(b) by 223 days.

(21) Appl. No.: 16/177,355

(22) Filed: Oct. 31, 2018

(65) Prior Publication Data
US 2019/0128969 A1 May 2, 2019

(30) Foreign Application Priority Data
Nov. 1, 2017 (CN) .......................... 2017 1 1058232

(51) Int. Cl.
*G01R 31/36* (2020.01)
*G01N 27/416* (2006.01)
(Continued)

(52) U.S. Cl.
CPC ......... *G01R 31/389* (2019.01); *G01R 31/367* (2019.01); *G01R 31/3835* (2019.01);
(Continued)

(58) Field of Classification Search
CPC .............. G01R 31/362; G01R 31/3662; G01R 31/367; G01R 31/3646; G01R 31/3648;
(Continued)

(56) References Cited

U.S. PATENT DOCUMENTS 7,576,545 B2 * 8/2009 Singh ................ H01M 10/0525
324/427
2011/0301931 A1 12/2011 Gering
(Continued)

FOREIGN PATENT DOCUMENTS

CN 101692119 A 4/2010
CN 103529301 A 1/2014
(Continued)

OTHER PUBLICATIONS

Chris White, Justin Deveau, Lukas G. Swan, "Evolution of Internal Resistance during Formation of Flooded Lead-Acid Batteries", Journal of Power Sources, Jul. 22, 2016, pp. 160-170, vol. 327, Elsevier B.V.

*Primary Examiner* — Minh N Tang
(74) *Attorney, Agent, or Firm* — Cheng-Ju Chiang

(57) ABSTRACT

The present disclosure provides a method for measuring an internal resistance of a battery, after discharging/charging the battery under a preset constant-current, acquiring voltages of the battery within a period from ending the discharging/charging to a time when the voltage reaches stable, and then calculating different corresponding internal resistances caused by ohmic polarization, electrochemical polarization and concentration polarization separately. Since it is different for the orders of the magnitude of the characteristic time which these different polarizations need to get back into new equilibrium state after ending the discharging/charging, the method of the present disclosure classifies the internal resistances caused by these polarizations and calculated different internal resistances corresponding to the polarizations. Both the comparison with a result measured by other method and multiple embodiments in the application justify that the method in the present disclosure has high reliability and strong practicability.

22 Claims, 3 Drawing Sheets

(51) Int. Cl.
  *G01R 31/389* (2019.01)
  *H01M 10/44* (2006.01)
  *H01M 10/48* (2006.01)
  *G01R 31/3835* (2019.01)
  *G01R 31/367* (2019.01)
  *G01R 27/02* (2006.01)

(52) U.S. Cl.
  CPC ......... *H01M 10/44* (2013.01); *H01M 10/486* (2013.01); *G01R 27/02* (2013.01)

(58) Field of Classification Search
  CPC .. G01R 31/3835; G01R 31/389; G01G 27/02; H01M 10/44; H01M 10/486; G01N 27/02
  See application file for complete search history.

(56) References Cited

U.S. PATENT DOCUMENTS

2013/0138369 A1  5/2013  Papana et al.
2019/0137569 A1* 5/2019  Swan .................. G01R 31/367

FOREIGN PATENT DOCUMENTS

| CN | 103884991 A | 6/2014 |
| CN | 106353687 A | 1/2017 |
| WO | 2017/006319 A1 | 1/2017 |

\* cited by examiner

METHOD FOR MEASURING THE INTERNAL RESISTANCE OF BATTERIES

CROSS REFERENCE TO RELATED APPLICATION

The present application is based on and claims priority of Chinese Patent Application No. 201711058232.2, filed on Nov. 1, 2017. The entire disclosure of the above to identified application, including the specification and claims are incorporated herein by reference in its entirety.

FIELD OF THE INVENTION

The present disclosure relates to a method for measuring the internal resistance of batteries.

BACKGROUND OF THE INVENTION

Internal resistance of batteries has great influence on the release of battery capacity, high power charge-discharge performance and internal heat generation. Because of this, when designing batteries, internal resistance would be an important parameter which needs key detection. There are several factors which would influence the internal resistance, including the conductive performances of electrode, electrolyte and current collector, the electrochemical performance between electrode active material and the electrolyte, and the transmission performance of electric charge in solid and liquid phases. It is absolutely essential to find a method which can distinguish internal resistances caused by different factors, if achieved, such method would play an important role on optimizing the design to battery cells and modules, and on analyzing the failure mechanism thereof.

Conventionally, there are mainly two methods which are commonly used to measure the internal resistance of batteries, one is a direct current (abbr. as DC) method, the other is an alternating current (abbr. as AC) method.

First example of the DC method to measure the internal resistance is generally as below: discharging under a constant-current at certain state of charge (abbr. as SOC) for certain time, such as 5 s, 10 s, 20 s etc., recording an initial voltage which usually equals to open circuit voltage and a discharge cut-off voltage which generally refers to the lowest voltage during the discharge thereof, obtaining a voltage difference between the initial voltage and the discharge cut-off voltage wherein the voltage difference is generally by the former subtracting the latter, and dividing the voltage difference by the constant-current applied during discharging to yield a value, which is regarded as DC internal resistance of the battery. Patent application No. CN 103529301A is an example to this.

Second example of the DC method provides a method to measure the internal resistance by taking advantage of voltage rising after discharge or voltage drop after charge. Conventionally, there are three types of polarizations existing: ohmic polarization, electrochemical polarization and concentration polarization, and the classification thereto is based on different reasons that cause the polarization during charge/discharge. As is known to all, due to the existence of polarization phenomenon, there is certain deviation between a transient voltage and an actual voltage of the battery during charge or discharge. The transient voltage is higher than the actual voltage during charge, then the polarization decreases when ending charge, and the voltage would drop accordingly. Meanwhile, the transient voltage is slightly lower than the actual voltage during discharge, then the polarization disappears after ending discharge, and the voltage would rise accordingly. Based on the principles described above, the second example of the DC method is conducted as below: recording a voltage measured at a first point while discharge/charge ended and voltage rise/drop, recording a voltage when discharge/charge ended, and calculating a voltage difference between the two voltages recorded above, and finally dividing the voltage difference by the current applied before ending discharge/charge to yield an ohmic internal resistance of the battery.

However, there is no clear and definite standard on the determination of the first point while discharge/charge ends and voltage rise/drop, which depends on a resolution ratio of measuring instrument. Hence, the yielded result is inaccuracy and fails to reflect actual physical meaning. Practically, a characteristic time (also called time constant) of the ohmic polarization (also called resistance polarization) is very short, generally of the order of magnitude of about 10 microseconds. Step back to the second example of the DC method described above, since the first point depends on the resolution ratio of measuring instrument, taken the first point as a point where the ohmic polarization disappears has great arbitrary and uncertainty. Even merely 0.1 second deviation would still be enormous relative to the characteristic time of the ohmic polarization. Further, since there is an electric double layer exists on electrode surface, at initial phase where discharge/charge current ends, the electric double layer needs to be charged/discharged, just because of this, the voltage would not rise/drop promptly but slowly. Based on the reasons above, it is impractical to determine where the ohmic polarization disappears merely by selecting the first point when the voltage rises/drops, and the result obtained by this method is also inaccurate. Meanwhile, the DC method described above fails to distinguish these polarizations caused by different reasons either, i.e., the ohmic polarization, the electrochemical polarization and the concentration polarization.

The AC method to measure the internal resistance has two general ways. In a first way of the AC method, the internal resistance is directly measured by an AC internal resistance measuring means at a frequency of generally around 1 KHz. However, this way is only suitable to measure the ohmic internal resistance, while it is difficult to be applied to measure the charge-transfer internal resistance caused by electrochemical polarization or the diffusion internal resistance caused by concentration polarization. In a second way of the AC method, the internal resistance is measured using an AC impedance spectroscopy, which is also called electrochemical impedance spectroscopy (abbr. as EIS). Such second way can measure the internal resistance only when the battery is close to a state of equilibrium. Further, measuring the AC impedance spectroscopy by EIS method requires extremely small voltage disturbance range, generally at 5 mV, since the actual current is far beyond the scope permitted by EIS measurement, the second way using EIS would practically fail to measure the internal resistances above in actual use.

SUMMARY OF THE INVENTION

The present disclosure provides a method for measuring an internal resistance of batteries, the internal resistance includes an ohmic internal resistance, a charge-transfer internal resistance and a diffusion internal resistance, and the method includes the following steps: first, providing a battery, and controlling a temperature of the battery to a measure temperature; and then, discharging/charging the battery under a preset constant-current I for a preset time and then ending the discharging/charging, acquiring voltages of the battery from a time ending the discharging/charging to a time when the voltage reaches stable; next, recording a voltage V1 at a time ending the discharging/charging, a voltage V2 when an ohmic overpotential disappears, a voltage V3 when both the ohmic overpotential and an electrochemical overpotential disappear, and/or a voltage V4 when all of the ohmic overpotential, the electrochemical overpotential and a concentration overpotential disappear; finally, calculating the ohmic internal resistance, the charge-transfer internal resistance and/or the diffusion internal resistance separately based on the voltages V1, V2, V3 and/or V4.

Furthermore, the ohmic internal resistance Ro is calculated based on a formula Ro=|V2−V1|/I. The charge-transfer internal resistance is calculated based on a formula Rct=|V3−V2|/I. The diffusion internal resistance is calculated based on a formula Rd=|V4−V3|/I.

The present disclosure provides a method for measuring an internal resistance of batteries, which includes the following steps:

Step one, providing a battery to be tested, and controlling a temperature of the battery to a measure temperature.

Step two, discharging/charging the battery under a preset constant-current I for a preset time and then ending the discharging/charging, acquiring voltages of the battery within a period from a time ending the discharging/charging to a time when the voltage reaches stable, where the voltage is labeled as V0; recording a voltage V1 at the time ending the discharging/charging, and a voltage V2 when the ohmic overpotential disappears.

Step three, calculating an ohmic internal resistance Ro based on a formula Ro=|V2−V1|/I.

In the present disclosure of the method above, said controlling a temperature of the battery to a measure temperature in Step one is realized by the following steps: first adjusting working environment to a desired measuring temperature, such as room temperature or other permissible battery operating temperature, and then placing the battery into the working environment until a temperature of the battery reaches stable, that is, to be consistent with that of the working environment and approaching stability with a permissible error within ±2° C.

In the present disclosure, said discharging/charging is conducted by a battery tester. Meanwhile, said acquiring voltages of the battery are conducted by a high-speed data acquisition system. To be more detail, step two is realized by the following: first, connecting the battery with the battery tester and the high-speed data acquisition system, wherein a resolution ratio of the high-speed data acquisition system is preferably $10^6$ Sa/s or above. After resting under working environment without load for a period of time, for example, 0-2 hours or above depending on actual needs, a stable voltage of the battery reaches. After that, discharging/charging under the constant-current is performed. FIG. 1 shows the connection relationship of the instruments to the battery during measuring, wherein a computer is connected with the battery tester and the high-speed data acquisition system separately, and the anode/cathode of the battery is connected to the battery tester and the high-speed data acquisition system separately.

Meanwhile, in Step two, after ending the discharging/charging, acquiring the voltage V2 when the ohmic overpotential disappears, that is, acquiring the voltage at the time when ending the discharging/charging, the battery load loss and the ohmic overpotential disappears. The orders of magnitude of the characteristic time of the ohmic polarization are within 1 microsecond to 1 millisecond. It is found in actual measurement that due to an effect of an electric double layer at the solid-liquid interface within the battery, the rising/drop of the voltage is a slow process, after that there is an obvious plateau whose voltage being V2. Along this, the value point of V2 would be at a first plateau after the rising/drop of the voltage from V1. FIG. 2 shows voltage curve and current profile changing with time during discharging, and FIG. 3 shows voltage curve and current profile changing with time during charging. Both FIG. 2 and FIG. 3 point out where the voltage V2 is.

Measuring the ohmic internal resistance of the battery by AC method under same circumstance as that in the present disclosure, comparing it with that obtained by the method of the present disclosure at the same circumstance. The comparison result justifies the method for taking the value points of voltage V2, and also validates the accuracy of the method of the present disclosure. Please note that the characteristic times of the electrochemical polarization and the concentration polarization are far more than that of the ohmic polarization, hence, it is assumed herein that when taking the value points of V2, the changes to the electrochemical polarization and the concentration polarization are omitted during the period between where the voltages V1 and V2 is selected.

The present disclosure also provides another method for measuring an internal resistance of batteries, which includes the following steps:

Step one, providing a battery to be tested, and controlling a temperature of the battery to a measure temperature.

Step two, discharging/charging the battery under a preset constant-current I for a preset time and then ending the discharging/charging, immediately followed by acquiring voltages of the battery within a period from a time ending the discharging/charging to a time when the voltage reaches stable, recording a voltage V2 when the ohmic overpotential disappears, and a voltage V3 when both the ohmic overpotential and the electrochemical overpotential disappear.

Step three, calculating a charge-transfer internal resistance based on a formula Rct=|V3−V2|/I.

In this embodiment, the voltage value after both the ohmic overpotential and the electrochemical overpotential disappear is labeled as V3. The value point of V3 locates within a characteristic time scope of the electrochemical polarization after the voltage V1, wherein the orders of magnitude of the characteristic time are between 1 millisecond to 1 second. In the present disclosure, the value of V3 are determined by a formula |dV/dt|/V<C1, that is, the points where at certain time a ratio between a voltage change-value relative to time and the voltage at that time is less than a preset value C1 after V2.

Regarding how to determine the value of C1, the value of C1 is generally between 0.001 $s^{-1}$ and 0.5 $s^{-1}$. If the value of C1 is too large, there is great error between the calculated Rct value and actual value thereof; meanwhile, if the value of C1 is too small, the effect to the acquired data caused by the concentration polarization change would have to be considered. After a plurality of experiments, it is proved that the value of C1 between 0.01 $s^{-1}$ and 0.2 $s^{-1}$ could not only assure the accuracy of the result but also effectively decrease the effect brought by the concentration polarization change.

In another embodiment of the present disclosure, said V3 is a voltage value at certain time where a ratio between a voltage change-value relative to time and the voltage at that time is less than a preset value C1, and the value of C1 is between 0.01 $s^{-1}$ and 0.2 $s^{-1}$.

When the value of C1 is between 0.01 s$^{-1}$ and 0.2 s$^{-1}$, effects brought by the concentration polarization change would be effectively reduced, and the calculated result would be more accuracy.

It should be understood herein that since a characteristic time of the concentration polarization is far more than that of the electrochemical polarization, it is assumed herein that when taking the value of C1, the changes to the concentration polarization is omitted during the period between the voltages V2 and V3. Errors caused by the omission thereto are within acceptable limits.

The present disclosure further provides still another method for measuring an internal resistance of batteries, which includes the following steps:

Step one, providing a battery to be tested, and controlling a temperature of the battery to a measure temperature.

Step two, discharging/charging the battery under a preset constant-current I for a preset time and then ending the discharging/charging, immediately followed by acquiring voltages of the battery within a period from ending the discharging/charging to when the voltage reaches stable, recording a voltage V3 when both the ohmic overpotential and the electrochemical overpotential disappear, and a voltage V4 when all of the ohmic overpotential, the electrochemical overpotential and the concentration overpotential disappear.

Step three, calculating a diffusion internal resistance based on a formula Rd=|V4−V3|/I.

The value of voltage V4 is a voltage at a time when all the ohmic overpotential, the electrochemical overpotential and the concentration overpotential disappear, and is a voltage at a time when the battery builds new equilibrium, i.e., the battery voltage reaches stable. The value of V4 depends on different battery design and different discharging/charging time, for example, the discharging/charging time may be at least 30 minutes. The voltage reaches stable, means the voltage of the battery remains relatively stable, wherein an error of ±2% is permissible.

In one embodiment of the present disclosure, said measure temperature is between −60° C. and 150° C. In another embodiment, said measure temperature is between −30° C. and 60° C. In actual practice, the working ambient temperature of the battery is generally between a temperature range from −30° C. to 60° C. Selecting such temperature range to measure is mainly to make sure that the measured internal resistance reflects actual internal resistance of most batteries, and further make sure that it can also measure the internal resistance under extreme temperature such as above 60° C.

There is no limitation on a state of charge (abbr. as SOC) of the batteries to be tested in the present disclosure, basically, an SOC of the battery is between 0% and 100%, or 25%-95%, or 50%. In one embodiment of the present disclosure, the battery is at 50% SOC. In another embodiment of the present disclosure, the battery is at 95% SOC. In yet another embodiment of the present disclosure, the battery is at 25% SOC.

In one embodiment of the present disclosure, the preset constant-current I is selected from any value within 0.1 C to 30 C. In another embodiment of the present disclosure, the preset constant-current I is selected from any value within 1 C to 10 C.

In the present disclosure, the method for measuring the internal resistance is discussed separately according to different circumstances, i.e., considering different characteristic times caused by different polarizations, and considering different times needed for these polarizations to get back into an equilibrium state during a relaxation time after ending the discharging/charging. Generally, the ohmic polarization is mainly formed when the current flows through an ohmic resistance of the electrode system, generally, it rapidly disappears after ending the discharging/charging. The characteristic time thereof is between 1 microsecond and 1 millisecond. The electrochemical polarization is mainly caused by the electric charges transferring between an electrode active material and an electrolyte interface layer. Since the interface layer is generally thin enough, the time for the electrochemical polarization to disappear after ending the discharging/charging (such time is called a characteristic time) is also short, for example, the characteristic time thereof is between 1 millisecond to 1 second. The concentration polarization includes concentration polarizations both in the electrolyte and in the electrode active material. The characteristic time of the former is generally between 1 second to 1000 seconds, and that of the latter is generally between 100 seconds and 10000 seconds. In the present disclosure, the internal resistance is classified into an ohmic internal resistance, a charge-transfer internal resistance and a diffusion internal resistance separately according to the ohmic polarization, the electrochemical polarization and the concentration polarization, and the classification is according to different characteristic time needed for these polarizations to get back to the equilibrium state after ending the discharging/charging. Hence, the method of the present disclosure has better accuracy and stronger practicability.

The method of the present disclosure is applicable in different types of batteries and is effective to separate the internal resistances based on the ohmic polarization, the electrochemical polarization and the concentration polarization. The comparison with the internal resistance measured by EIS method under same measuring conditions proves the accuracy of the method provided by the present disclosure. Further, the method of the present disclosure would play important roles in optimizing battery design, analyzing reasons for battery failure and internal heat generation of batteries, and estimating the SOC/SOH/power limits.

It should be understood that the internal resistance is divided into an ohmic internal resistance caused by an ohmic polarization, a charge-transfer internal resistance caused by an electrochemical polarization and a diffusion internal resistance caused by a concentration polarization. In the method of the present disclosure, the internal resistance is measured in a way of separately measuring the ohmic internal resistance, the charge-transfer internal resistance and the diffusion internal resistance accordingly. Hence, the method can be applied to measure any of the three internal resistances above, it can further be applied to measure all the internal resistances, which depends on actual needs. For example, the ohmic internal resistance Ro is based on a formula Ro=|V2−V1|/I, wherein V1 and V2 are recorded while acquiring voltages within a period from a time ending the discharging/charging to a time when the voltage reaches stable. For another example, the charge-transfer internal resistance is measured based on a formula Rct=|V3−V2|/I, wherein V3 and V2 are recorded while acquiring voltages within the period. For next example, the diffusion internal resistance is measured based on a formula Rd=|V4−V3|/I, wherein V3 and V4 are recorded while acquiring voltages within the same period. Meanwhile, if measuring the internal resistance which includes the three internal resistances above, V1, V2, V3 and V4 are all recorded, and each of the three internal resistances are calculated separately based on their corresponding formulas. Whatever, the acquiring voltages within a period from a time ending the discharging/ charging to a time when the voltage reaches stable is done at one go to yield a voltage curve, and the voltages V1, V2, V3 and V4 are derived therefrom, if needed.

DETAILED DESCRIPTION OF PREFERRED EMBODIMENTS

Embodiments of the present disclosure will now be described more apparently and completely with reference to the embodiments. Obviously, the illustrated embodiments are only a part but not all of the embodiments of the present disclosure. All the other embodiments which could be obtained without creativity by one of ordinary skill in the art according to the illustrated embodiments would be claimed within the scope of the present disclosure.

Embodiment 1

The instruments applied in this embodiment mainly include a computer, a battery tester, and a high-speed data acquisition system, wherein the battery tester is provided by Shenzhen Neware factory having a product model of CT-4004-5V300A-NTFA and is used to charge/discharge the battery; the high-speed data acquisition system is used to detect the voltage of batteries. Further, an Autolab PGSTAT302N electrochemical workstation is also applied in this embodiment, however, it is merely used in comparison experiment, not necessary equipment of the present invention. Besides, other common instruments may also be applied therein.

Figure 1:
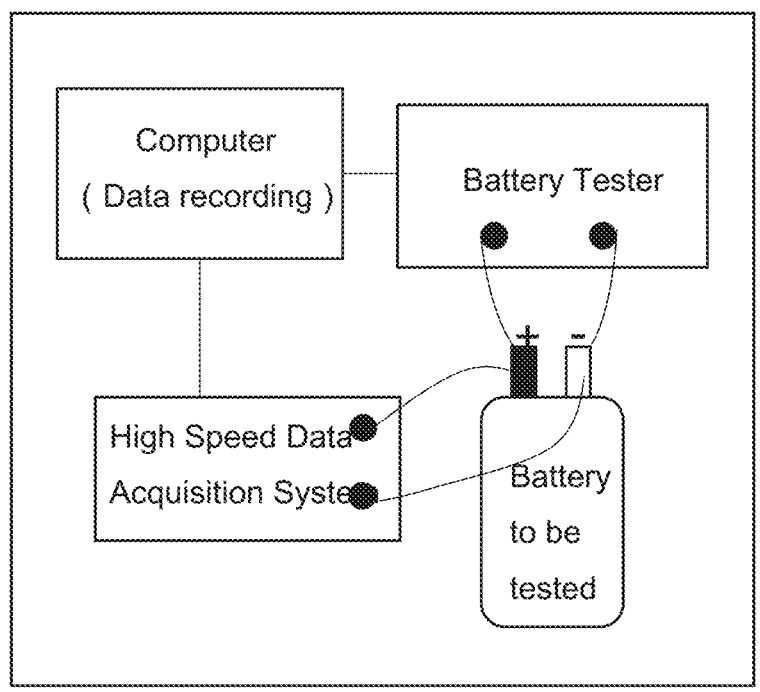
FIG. 1 is a curve graph illustrating the connection relationship between the measuring equipment and the battery during the internal resistance measurement.

Lithium-ion battery A is measured in this embodiment, whose cathode is made of ternary composites, and the anode thereof is made of porous carbon materials. The label capacity thereof is 10 Ah. The method for measuring the internal resistance of the battery A includes the following steps:

First, connecting the battery A with the measuring instruments in a way as shown in FIG. 1, in detail, connecting the battery with the battery tester and the high-speed data acquisition system separately, and both the battery tester and the high-speed data acquisition system further connect with the computer.

Second, placing the lithium-ion battery A into a thermostatic chamber, controlling a temperature of the battery A to be at 25° C.

Third, adjusting the SOC of the lithium-ion battery A to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery A to be 25° C.

Fifth, recording an electrochemical impedance spectroscopy (abbr. as EIS) of the lithium-ion battery A by an electrochemical workstation.

Sixth, adjusting the temperature of the lithium-ion battery to 25° C.

Seventh, discharging the lithium-ion battery A with a constant current of 1 C for 10 s, acquiring the voltage data simultaneously by the battery tester and the high-speed data acquisition system, wherein a time-step of the high-speed data acquisition system is set as 10 microseconds. The constant current during discharging is named as a discharging current, which is applicable hereinafter.

Eighth, resting for 1 hour.

Ninth, adjusting the SOC of the lithium-ion battery A to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Tenth, repeating steps sixth to ninth, except that the discharging current is changed to 2 C, 3 C, 4 C, 5 C or 6 C separately each time, and then all tests finished.

It should be understood that in step seventh, a time of the discharging, i.e., discharging time, is set as 10 s, which is just an example, the discharging time is adjustable according to actual needs. It is the same in any of the other embodiments below, and no further explanation would be made later.

Figure 2:
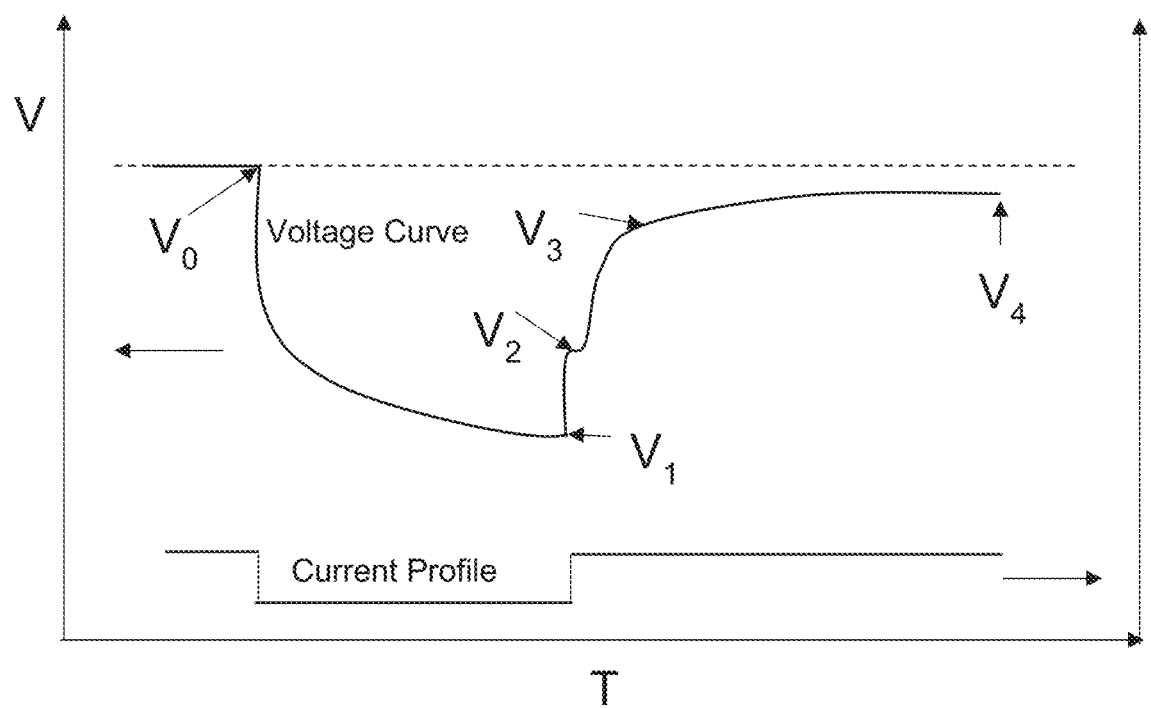
FIG. 2 is a curve graph illustrating the voltage and current changing with time in one embodiment of the present disclosure.

FIG. 2 is a curve graph illustrating the measured voltage/current changing with time in this embodiment, wherein horizontal axis represents for time. The time shown in the horizontal axis is only for reference, which does not reflect actual proportion of time.

TABLE 1

Ohmic internal resistance values of the lithium-ion battery A

| | Discharging current/C | | | | | |
|---|---|---|---|---|---|---|
| | 1 | 2 | 3 | 4 | 5 | 6 |
| $V_1$/V | 3.5623 | 3.4955 | 3.4409 | 3.3969 | 3.3316 | 3.2907 |
| $V_2$/V | 3.5727 | 3.5156 | 3.4711 | 3.4363 | 3.3829 | 3.3518 |
| $(V_2 - V_1)$/V | 0.0104 | 0.0201 | 0.0302 | 0.0394 | 0.0513 | 0.0610 |
| $R_o$/mΩ | 1.037 | 1.007 | 1.007 | 0.984 | 1.025 | 1.017 |

Table 1 shows the ohmic internal resistance (Ro) values of the lithium-ion battery A which are measured and calculated by the method of embodiment 1, wherein the discharging current is from 1 C to 6 C separately. The ohmic internal resistance Ro is calculated according to a formula Ro=(V2−V1)/I, wherein V1 represents for a voltage value when ending the discharging, and V2 represents for a plateau voltage of the first plateau after the voltage rising from V1. As shown in Table 1, the values of the ohmic internal resistance basically almost do not change with the discharging current, which is coincident with the characteristic of the ohmic internal resistance itself.

Figure 4:
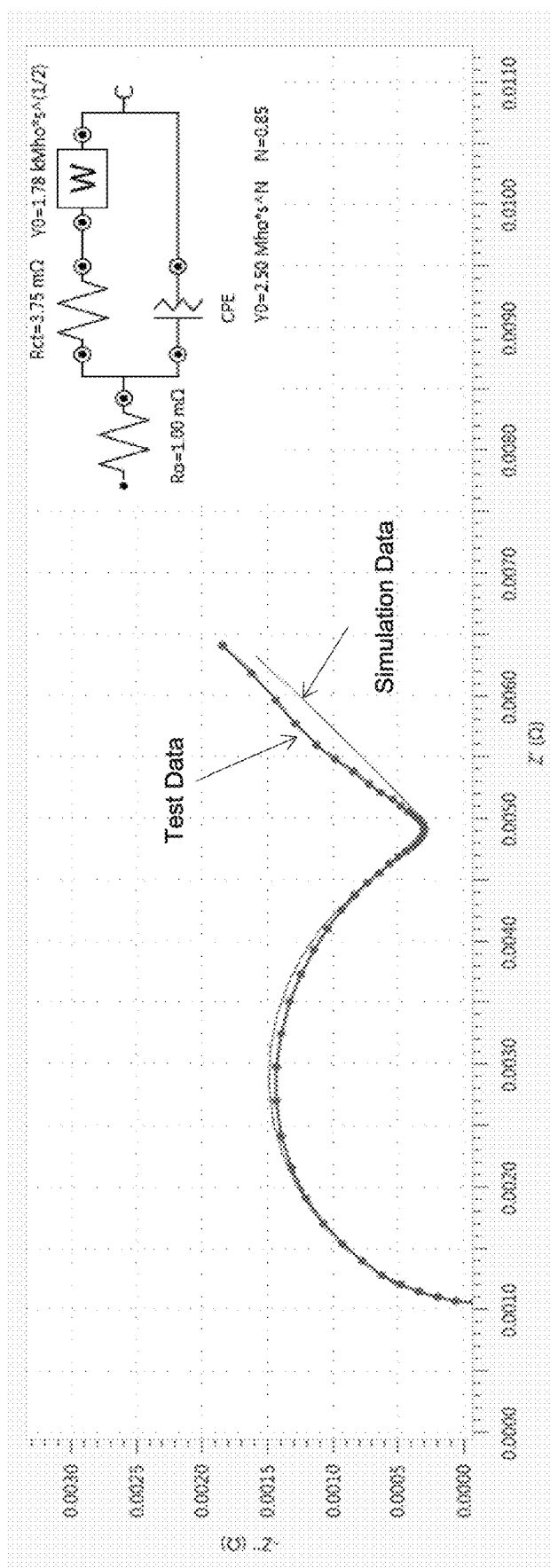
FIG. 4 shows a test curve formed by EIS test data in one embodiment and a simulation curve fitted by an equivalent circuit.

Besides, FIG. 4 shows EIS curves measured by electrochemical workstation (measured curve which is shown in FIG. 4 as a dotted curve) and fitted by an equivalent circuit (fitted curve which is shown in FIG. 4 as an undotted curve). On upper right corner of FIG. 4 is a schematic view of the equivalent circuit above, which shows fitted values of each component. From the fitted values of the components, a fitted value Ro of the ohmic internal resistance of the lithium-ion battery A could be obtained to be 1.00 mΩ, which is very similar to the measured values of the ohmic internal resistance shown in Table 1. The results justify that the method for measuring and calculating the ohmic internal resistance in the present disclosure has a high accuracy.

TABLE 2

Charge-transfer internal resistance values of the lithium-ion battery A

| | Discharging current/C | | | | | |
|---|---|---|---|---|---|---|
| | 1 | 2 | 3 | 4 | 5 | 6 |
| $V_2$/V | 3.5727 | 3.5156 | 3.4711 | 3.4363 | 3.3829 | 3.3518 |
| $V_3$/V | 3.6050 | 3.5843 | 3.5648 | 3.5507 | 3.5321 | 3.5172 |
| $(V_3 - V_2)$/V | 0.0323 | 0.0687 | 0.0937 | 0.1144 | 0.1492 | 0.1655 |
| $R_c$/mΩ | 3.231 | 3.434 | 3.124 | 2.861 | 2.985 | 2.758 |

Table 2 shows the charge-transfer internal resistance values (Rct) of the lithium-ion battery A measured and calculated by the method described in embodiment 1 when the discharging current changes from 1 C to 6 C separately, wherein the calculation is based on a formula Rct=(V3−V2)/I, and the value points of V3 are determined by a formula |dV/dt|/V<C1, i.e., the points where at certain time a ratio between a voltage change-value relative to time and the voltage at that time is less than a preset value C1. In this embodiment, the value of C1 is 0.05 $s^{-1}$.

Using a straight line to fit the values in Table 2 at different discharging currents would yield a fit line whose fit equation being y=−0.013x+3.5, wherein y represents for Rct with a unit of mΩ, and x represents for a discharging current whose unit being A. A conclusion can be drawn from the fit equation that if the current x equals to 0, the value of Rct is 3.5 mΩ.

Further, referring to FIG. 4, a fit value of the charge-transfer internal resistance (Rct) of the lithium-ion battery A is 3.75 mΩ, which is obtained by fitting the EIS data with the equivalent circuit in FIG. 4. The fit value is very similar to the value 3.5 mΩ drawn from the above fit equation when the current equals to 0. The result suggests that the charge-transfer internal resistance measured by EIS method is an exceptional case of the method in the present disclosure when the current applied close to 0. The result also justifies that the method in the present disclosure has strong efficiency and high accuracy.

Table 3 shows the diffusion internal resistance (Rd) values of the lithium-ion battery A which is measured and calculated by the method described in embodiment 1 when the discharging current changes from 1 C to 6 C separately, wherein the calculation is based on a formula Rd=(V4−V3)/I, and the value points of V4 refers to a voltage value where the voltage reaches stable.

TABLE 3

Diffusion internal resistance values of the lithium-ion battery A

| | Discharging current/C | | | | | |
|---|---|---|---|---|---|---|
| | 1 | 2 | 3 | 4 | 5 | 6 |
| $V_3$/V | 3.6050 | 3.5843 | 3.5648 | 3.5507 | 3.5321 | 3.5172 |
| $V_4$/V | 3.6272 | 3.6238 | 3.6207 | 3.6173 | 3.6139 | 3.6108 |
| $(V_4 - V_3)$/V | 0.0222 | 0.0395 | 0.0559 | 0.0666 | 0.0818 | 0.0936 |
| $R_d$/mΩ | 2.220 | 1.975 | 1.863 | 1.665 | 1.636 | 1.560 |

Since the diffusion internal resistance value of the lithium-ion battery A cannot be measured directly by EIS method, it fails to be compared with the diffusion internal resistance values measured by the method of the present disclosure. This reflects the advantage of the method in the present disclosure over EIS method.

Embodiment 2

The instruments applied in this embodiment mainly include a computer, a battery tester and a high-speed data acquisition system, wherein the battery tester is provided by Shenzhen Neware factory having a product model of CT-4004-5V300A-NTFA and is used to charge/discharge; the high-speed data acquisition system is used to detect the voltage of batteries. Besides, other common instruments may be also applied therein.

Lithium-ion battery B is measured in this embodiment, whose cathode is made of ternary composites, and the anode thereof is made of porous carbon materials. The label capacity thereof is 10 Ah. The method for measuring the internal resistance of the battery B includes the following steps:

First, connecting the battery B with the measuring instruments in a way as shown in FIG. 1. In detail, connecting the battery with the battery tester and the high-speed data acquisition system separately, and both the battery tester and the high-speed data acquisition system further connect with the computer.

Second, placing the lithium-ion battery B into a thermostatic chamber, controlling a temperature of the battery B to be at 25° C.

Third, adjusting the SOC of the lithium-ion battery B to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery B to 25° C.

Fifth, charging the lithium-ion battery B with a constant current of 1 C for 10 s, acquiring the voltage data simultaneously by the battery tester and the high-speed data acquisition system, wherein a time-step thereof is set as 10 microseconds. Here the constant current during charging is called as a charging current, which is the same hereinafter.

Sixth, resting for 1 hour.

Seventh, adjusting the SOC of the lithium-ion battery B to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Eighth, repeating steps fourth to seventh, except that the charging current is changed to 2 C, 4 C etc. each time, and then finishing all tests.

Figure 3:
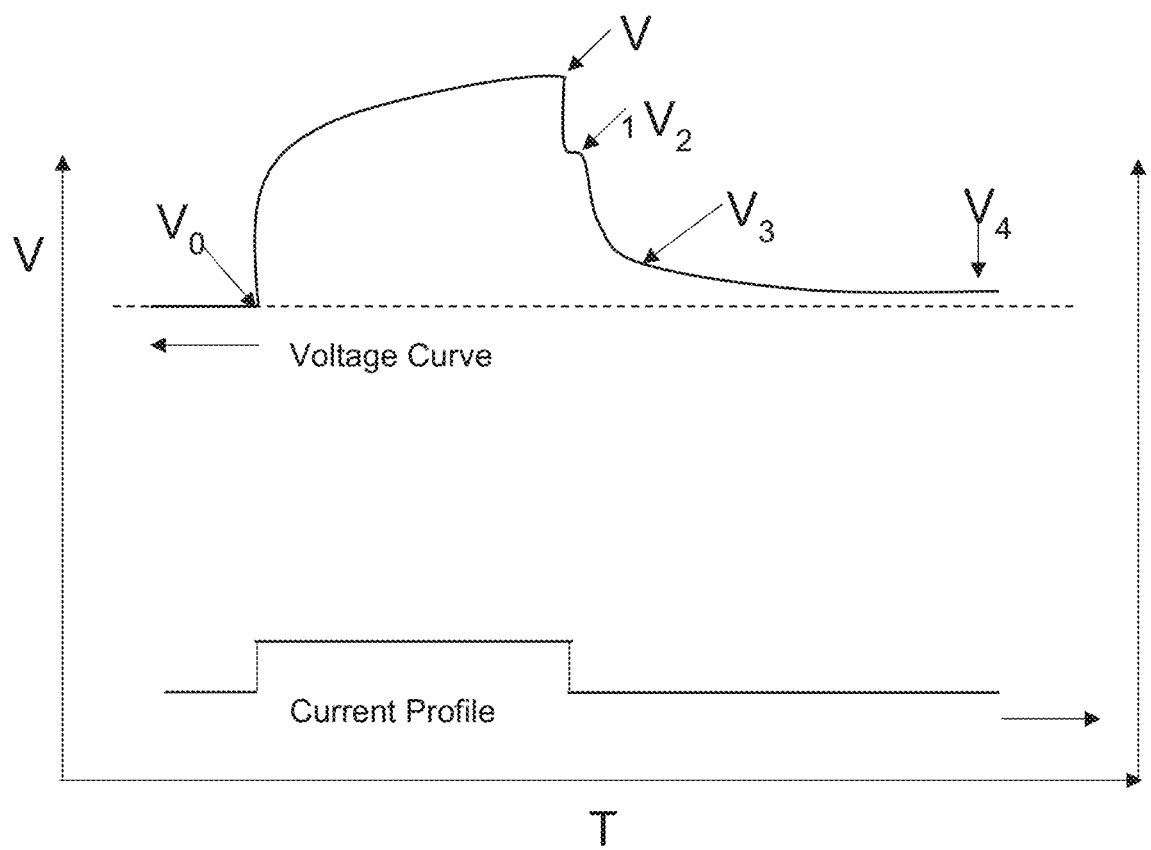
FIG. 3 is a curve graph illustrating the voltage and current changing with time in another embodiment of the present disclosure.

FIG. 3 is a curve graph illustrating the measured voltage/current changing with time in this embodiment, wherein horizontal axis represents for time. The time shown in the horizontal axis is only for reference, which does not reflect actual proportion of time.

Table 4 shows the ohmic internal resistance (Ro) values of the lithium-ion battery B which are measured and calculated by the method of embodiment 2, wherein the charging current is 1 C, 2 C, 4 C, 6 C separately. The ohmic internal resistance Ro is calculated according to a formula Ro=(V1−−V2)/I, wherein V1 represents for a voltage value when ending the charging, and V2 represents for a plateau voltage of the first plateau after the voltage dropping from V1.

TABLE 4

Ohmic internal resistance values of the lithium-ion battery B

| | Charging current/C | | | |
|---|---|---|---|---|
| | 1 | 2 | 4 | 6 |
| $V_1/V$ | 3.7024 | 3.7659 | 3.8602 | 3.9395 |
| $V_2/V$ | 3.6920 | 3.7448 | 3.8211 | 3.8812 |
| $(V_1 - V_2)/V$ | 0.0104 | 0.0211 | 0.0391 | 0.0583 |
| $R_o/m\Omega$ | 1.040 | 1.055 | 0.977 | 0.972 |

Table 5 shows the charge-transfer internal resistance (Rct) values of the lithium-ion battery B measured and calculated by the method described in embodiment 2 when the charging current is 1 C, 2 C, 4 C, 6 C separately, wherein the calculation is based on a formula Rct=(V2−V3)/I, and the value points of V3 are determined by the formula $|dV/dt|/V<C1$, i.e., the points where at certain time a ratio between a voltage change-value relative to time and the voltage at that time is less than a preset value C1. In this embodiment, the value of C1 is 0.05 $s^{-1}$.

TABLE 5

Charge-transfer internal resistance values of lithium-ion battery B

| | Charging current/C | | | |
|---|---|---|---|---|
| | 1 | 2 | 4 | 6 |
| $V_2/V$ | 3.6920 | 3.7448 | 3.8211 | 3.8812 |
| $V_3/V$ | 3.6526 | 3.6670 | 3.6893 | 3.7094 |
| $(V_2 - V_3)//V$ | 0.0394 | 0.0778 | 0.1318 | 0.1718 |
| $R_{ct}/m\Omega$ | 3.935 | 3.890 | 3.296 | 2.863 |

Table 6 shows the diffusion internal resistance (Rd) values of the lithium-ion battery B measured and calculated by the method described in embodiment 2 when charging current is 1 C, 2 C, 4 C, 6 C separately, wherein the calculation is based on a formula Rd=(V3−V4)/I, and the value points of V4 refers to a voltage value where the voltage reaches stable.

TABLE 6

Diffusion internal resistance values of the lithium-ion battery B

| | Charging current/C | | | |
|---|---|---|---|---|
| | 1 | 2 | 4 | 6 |
| $V_3/V$ | 3.6526 | 3.6670 | 3.6893 | 3.7094 |
| $V_4/V$ | 3.6337 | 3.6331 | 3.6334 | 3.6337 |
| $(V_3 - V_4)/V$ | 0.0189 | 0.0339 | 0.0559 | 0.0757 |
| $R_d/m\Omega$ | 1.895 | 1.695 | 1.397 | 1.262 |

Embodiment 3

The instruments applied in this embodiment mainly includes a computer, a battery tester, and a high-speed data acquisition system, wherein the battery tester is provided by Shenzhen Neware factory having a product model of CT-4004-5V300A-NTFA and is used to charge/discharge the battery; the high-speed data acquisition system is used to detect the voltage of batteries. Besides, other common instruments may also be applied therein.

Lithium-ion battery C is measured in this embodiment, whose cathode is made of ternary composites, and the anode thereof is made of porous carbon materials. The label capacity thereof is 10 Ah. The method for measuring the internal resistance of the battery C includes the following steps:

First, connecting the battery C with the measuring instruments in a way as shown in FIG. 1. In detail, connecting the battery C with the battery tester and the high-speed data acquisition system separately, and both the battery tester and the high-speed data acquisition system further connect with the computer.

Second, placing the lithium-ion battery C into a thermostatic chamber, controlling a temperature of the battery C to be at −10° C.

Third, adjusting the SOC of the lithium-ion battery C to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery C to be −10° C.

Fifth, discharging the lithium-ion battery C with a constant current of 1 C for 10 s, acquiring the voltage data simultaneously by the battery tester and the high-speed data acquisition system, wherein a time-step of the high-speed data acquisition system is set as 10 microseconds. The constant current during discharging is named as a discharging current, which is applicable herein after.

Sixth, resting for 1 hour.

Seventh, adjusting the SOC of the lithium-ion battery A to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Eighth, repeating steps fourth to seventh, except that the discharging current in step fifth is changed to 1.5 C, 2 C, 2.5 C and 3 C separately each time until all tests finished.

TABLE 7

Ohmic internal resistance values of the lithium-ion battery C

| | Discharging current/C | | | | |
|---|---|---|---|---|---|
| | 1 | 1.5 | 2 | 2.5 | 3 |
| $V_1/V$ | 3.0508 | 2.9337 | 2.8403 | 2.7606 | 2.6874 |
| $V_2/V$ | 3.0649 | 2.9559 | 2.8680 | 2.7960 | 2.7313 |
| $(V_2 - V_1)/V$ | 0.0141 | 0.0222 | 0.0277 | 0.0354 | 0.0439 |
| $R_o/m\Omega$ | 1.410 | 1.480 | 1.385 | 1.416 | 1.463 |

Table 7 shows the ohmic internal resistance (Ro) values of the lithium-ion battery C which are measured and calculated by the method of embodiment 3, wherein the discharging current is from 1 C to 3 C separately. The ohmic internal resistance Ro is calculated according to a formula Ro=(V2−V1)/I, wherein V1 represents for a voltage value when ending the discharging, and V2 represents for a plateau voltage of the first plateau after the voltage rising from V1.

Table 8 shows the charge-transfer internal resistance (Rct) values of the lithium-ion battery C measured and calculated by the method described in embodiment 3 when the discharging current changes from 1 C to 3 C separately, wherein the calculation is based on a formula Rct=(V3−V2)/I, and the value points of V3 are determined by a formula $|dV/dt|/V<C1$, i.e., the points where at certain time a ratio between a voltage change-value relative to time and the voltage at that time is less than a preset value C1. In this embodiment, the value of C1 is 0.025 s$^{-1}$.

TABLE 8

Charge-transfer internal resistance values of the lithium-ion battery

| | discharging current/C | | | | |
|---|---|---|---|---|---|
| | 1 | 1.5 | 2 | 2.5 | 3 |
| $V_2/V$ | 3.0649 | 2.9559 | 2.8680 | 2.7960 | 2.7313 |
| $V_3/V$ | 3.4869 | 3.4628 | 3.4415 | 3.4201 | 3.4094 |
| $(V_3 - V_2)/V$ | 0.4220 | 0.5069 | 0.5735 | 0.6241 | 0.6781 |
| $R_{ct}/m\Omega$ | 42.204 | 33.795 | 28.673 | 24.964 | 22.604 |

Table 9 shows the diffusion internal resistance (Rd) values of the lithium-ion battery C which is measured and calculated by the method described in embodiment 3 when the discharging current changes from 1 C to 3 C separately, wherein the calculation is based on a formula Rd=(V4−V3)/I, and the value points of V4 refers to a voltage value where the voltage reaches stable.

TABLE 9

Diffusion internal resistance values of the lithium-ion battery C

| | discharging current/C | | | | |
|---|---|---|---|---|---|
| | 1 | 1.5 | 2 | 2.5 | 3 |
| $V_3/V$ | 3.4869 | 3.4628 | 3.4415 | 3.4201 | 3.4094 |
| $V_4/V$ | 3.6259 | 3.6238 | 3.6213 | 3.6188 | 3.6170 |
| $(V_4 - V_3)/V$ | 0.1390 | 0.1610 | 0.1798 | 0.1987 | 0.2076 |
| $R_d/m\Omega$ | 13.896 | 10.731 | 8.992 | 7.948 | 6.919 |

Embodiment 4

The instruments applied in this embodiment mainly include a computer, a battery tester, and a high-speed data acquisition system, wherein the battery tester is provided by Shenzhen Neware factory having a product model of CT-4004-5V300A-NTFA and is used to charge/discharge the battery; the high-speed data acquisition system is used to detect the voltage of batteries. Besides, other common instruments may also be applied therein.

Lithium-ion battery D is measured in this embodiment, whose cathode is made of ternary composites, and the anode thereof is made of porous carbon materials. The label capacity thereof is 10 Ah. The method for measuring the internal resistance of the battery D includes the following steps:

First, connecting the battery D with the measuring instruments in a way as shown in FIG. 1, in detail, connecting the battery with the battery tester and the high-speed data acquisition system separately, and both the battery tester and the high-speed data acquisition system further connect with the computer.

Second, placing the lithium-ion battery D into a thermostatic chamber, controlling a temperature of the battery D to be at 55° C.

Third, adjusting the SOC of the lithium-ion battery D to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery D to be 55° C.

Fifth, discharging the lithium-ion battery D with a constant current of 1 C for 10 s, acquiring the voltage data simultaneously by the battery tester and the high-speed data acquisition system, wherein a time-step of the high-speed data acquisition system is set as 10 microseconds. The constant current during discharging is called as a discharging current.

Sixth, resting for 1 hour.

Ninth, adjusting the SOC of the lithium-ion battery D to 50% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Eighth, repeating steps fourth to seventh, except that the discharging current in step fifth is changed to be 2 C, 4 C, 6 C, 8 C and 10 C separately each time until all tests finished.

Table 10 shows the ohmic internal resistance (Ro) values of the lithium-ion battery D which are measured and calculated by the method of embodiment 4, wherein the discharging current changes from 1 C to 10 C separately. The ohmic internal resistance Ro is calculated according to a formula Ro=(V2−V1)/I, wherein V1 represents for a voltage value when ending the discharging, and V2 represents for a plateau voltage of the first plateau after the voltage rising from V1.

TABLE 10

Ohmic internal resistance values of the lithium-ion battery D

| | discharging current/C | | | | | |
|---|---|---|---|---|---|---|
| | 1 | 2 | 4 | 6 | 8 | 10 |
| $V_1/V$ | 3.6136 | 3.5931 | 3.5519 | 3.5117 | 3.4744 | 3.4341 |
| $V_2/V$ | 3.6212 | 3.6081 | 3.5830 | 3.5580 | 3.5321 | 3.5080 |
| $(V_2 - V_1)/V$ | 0.0076 | 0.0150 | 0.0311 | 0.0463 | 0.0577 | 0.0739 |
| $R_o/m\Omega$ | 0.760 | 0.750 | 0.778 | 0.772 | 0.721 | 0.739 |

Table 11 shows the charge-transfer internal resistance (Rct) values of the lithium-ion battery D which is measured and calculated by the method described in embodiment 4 when the discharging current changes from 1 C to 10 C separately, wherein the calculation is based on a formula Rct=(V3−V2)/I, and the value points of V3 are determined by the formula $|dV/dt|/V<C1$, i.e., the points where at certain time a ratio between a voltage change-value relative to time and the voltage at that time is less than a preset value C1. In this embodiment, the value of C1 is 0.05 s$^{-1}$.

TABLE 11

Charge-transfer internal resistance values of the lithium-ion battery D

| | discharging current/C | | | | | |
|---|---|---|---|---|---|---|
| | 1 | 2 | 4 | 6 | 8 | 10 |
| $V_2/V$ | 3.6212 | 3.6081 | 3.5830 | 3.5580 | 3.5321 | 3.5080 |
| $V_3/V$ | 3.6227 | 3.6133 | 3.5941 | 3.5767 | 3.5577 | 3.5379 |
| $(V_3 - V_2)/V$ | 0.0015 | 0.0052 | 0.0111 | 0.0187 | 0.0256 | 0.0299 |
| $R_{ct}/m\Omega$ | 0.154 | 0.259 | 0.276 | 0.311 | 0.320 | 0.299 |

Table 12 shows the diffusion internal resistance (Rd) values of the lithium-ion battery D which is measured and calculated by the method described in embodiment 4 when the discharging current changes from 1 C to 10 C separately, wherein the calculation is based on a formula Rd=(V4−V3)/I, and the value points of V4 refers to a voltage value where the voltage reaches stable.

TABLE 12

Diffusion internal resistance values of the lithium-ion battery D

| | discharging current/C | | | | | |
|---|---|---|---|---|---|---|
| | 1 | 2 | 4 | 6 | 8 | 10 |
| $V_3$/V | 3.6227 | 3.6133 | 3.5941 | 3.5767 | 3.5577 | 3.5379 |
| $V_4$/V | 3.6303 | 3.6269 | 3.6194 | 3.6135 | 3.607 | 3.599 |
| $(V_4 - V_3)$/V | 0.0076 | 0.0136 | 0.0253 | 0.0368 | 0.0488 | 0.0608 |
| $R_d$/mΩ | 0.756 | 0.681 | 0.634 | 0.614 | 0.610 | 0.608 |

Embodiment 5

The instruments applied in this embodiment mainly include a computer, a battery tester and a high-speed data acquisition system, wherein the battery tester is provided by Shenzhen Neware factory having a product model of CT-4004-5V300A-NTFA and is used to charge/discharge the battery; the high-speed data acquisition system is used to detect the voltage of batteries. Besides, other common instruments may be also applied therein.

Lithium-ion battery E is measured in this embodiment, whose cathode is made of ternary composites, and the anode thereof is made of porous carbon materials. The label capacity thereof is 10 Ah. The method for measuring the internal resistance of the battery B includes the following steps:

First, connecting the battery E with the measuring instruments in a way as shown in FIG. 1. In detail, connecting the battery with the battery tester and the high-speed data acquisition system separately, and both the battery tester and the high-speed data acquisition system further connect with the computer.

Second, placing the lithium-ion battery E into a thermostatic chamber, controlling a temperature of the battery E to be at 25° C.

Third, adjusting the SOC of the lithium-ion battery E to 25% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery E to 25° C.

Fifth, discharging the lithium-ion battery E with a constant current (called charging current hereinafter) of 1 C for 10 s, acquiring the voltage data simultaneously by the battery tester and the high-speed data acquisition system, wherein a time-step thereof is set as 10 microseconds.

Sixth, resting for 1 hour.

Seventh, adjusting the SOC of the lithium-ion battery E to 25% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Eighth, repeating steps fourth to seventh, except that the discharging current is changed to 2 C, 3 C, 4 C, 5 C and 6 C each time, until all tests finished.

TABLE 13

Ohmic internal resistance values of the lithium-ion battery E

| | discharging current/C | | | | | |
|---|---|---|---|---|---|---|
| | 1 | 2 | 3 | 4 | 5 | 6 |
| $V_1$/V | 3.2263 | 3.1488 | 3.0835 | 3.0214 | 2.9709 | 2.9123 |
| $V_2$/V | 3.2364 | 3.1693 | 3.1152 | 3.0624 | 3.0228 | 2.9749 |
| $(V_2 - V_1)$/V | 0.0101 | 0.0205 | 0.0317 | 0.0410 | 0.0519 | 0.0626 |
| $R_o$/mΩ | 1.010 | 1.025 | 1.057 | 1.025 | 1.038 | 1.043 |

Table 13 shows the ohmic internal resistance (Ro) values of the lithium-ion battery E which are measured and calculated by the method of embodiment 5, wherein the discharging current is from 1 C to 6 C separately. The ohmic internal resistance Ro is calculated according to a formula Ro=(V2−V1)/I, wherein V1 represents for a voltage value when ending the discharging, and V2 represents for a plateau voltage of the first plateau after the voltage rising from V1.

TABLE 14

Charge-transfer internal resistance values of lithium-ion battery E

| | discharging current/C | | | | | |
|---|---|---|---|---|---|---|
| | 1 | 2 | 3 | 4 | 5 | 6 |
| $V_2$/V | 3.2364 | 3.1693 | 3.1152 | 3.0624 | 3.0228 | 2.9749 |
| $V_3$/V | 3.2770 | 3.2501 | 3.2300 | 3.2080 | 3.1982 | 3.1802 |
| $(V_3 - V_2)$/V | 0.0406 | 0.0808 | 0.1148 | 0.1456 | 0.1754 | 0.2053 |
| $R_{ct}$/mΩ | 4.058 | 4.041 | 3.826 | 3.640 | 3.509 | 3.422 |

Table 14 shows the charge-transfer internal resistance (Rct) values of the lithium-ion battery E measured and calculated by the method described in embodiment 5 when the discharging current changes from 1 C to 6 C separately, wherein the calculation is based on a formula Rct=(V3−V2)/I, and the value points of V3 are determined by the formula |dV/dt|/V<C1, i.e., the points where at certain time a ratio between a voltage change-value relative to time and the voltage at that time is less than a preset value C1. In this embodiment, the value of C1 is 0.05 s$^{-1}$.

TABLE 15

Diffusion internal resistance values of the lithium-ion battery E

| | discharging current/C | | | | | |
|---|---|---|---|---|---|---|
| | 1 | 2 | 3 | 4 | 5 | 6 |
| $V_3$/V | 3.2770 | 3.2501 | 3.2300 | 3.2080 | 3.1982 | 3.1802 |
| $V_4$/V | 3.3079 | 3.3038 | 3.3001 | 3.2958 | 3.2961 | 3.2911 |
| $(V_4 - V_3)$/V | 0.0309 | 0.0537 | 0.0701 | 0.0878 | 0.0979 | 0.1109 |
| $R_d$/mΩ | 3.092 | 2.684 | 2.337 | 2.195 | 1.957 | 1.848 |

Table 15 shows the diffusion internal resistance (Rd) values of the lithium-ion battery E which is measured and calculated by the method described in embodiment 5 when the discharging current changes from 1 C to 6 C separately, wherein the calculation is based on a formula Rd=(V4−V3)/I, and the value points of V4 refers to a voltage value where the voltage reaches stable.

Embodiment 6

The instruments applied in this embodiment mainly includes a computer, a battery tester, and a high-speed data acquisition system, wherein the battery tester is provided by Shenzhen Neware factory having a product model of CT-4004-5V300A-NTFA and is used to charge/discharge the battery; the high-speed data acquisition system is used to detect the voltage of batteries. Besides, other common instruments may also be applied therein.

Lithium-ion battery F is measured in this embodiment, whose cathode is made of ternary composites, and the anode thereof is made of porous carbon materials. The label capacity thereof is 10 Ah. The method for measuring the internal resistance of the battery F includes the following steps:

First, connecting the battery F with the measuring instruments in a way as shown in FIG. 1. In detail, connecting the battery F with the battery tester and the high-speed data acquisition system separately, and both the battery tester and the high-speed data acquisition system further connect with the computer.

Second, placing the lithium-ion battery F into a thermostatic chamber, controlling a temperature of the battery F to be at 25° C.

Third, adjusting the SOC of the lithium-ion battery F to 95% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Fourth, adjusting the temperature of the lithium-ion battery F to be 25° C.

Fifth, discharging the lithium-ion battery F with a constant current of 1 C for 30 s, acquiring the voltage data simultaneously by the battery tester and the high-speed data acquisition system, wherein a time-step of the high-speed data acquisition system is set as 10 microseconds. The constant current during discharging is named as a discharging current.

Sixth, resting for 1 hour.

Seventh, adjusting the SOC of the lithium-ion battery F to 95% according to its label capacity, and then its voltage reaching an equilibrium state. Generally, the adjusting the SOC is realized by discharging/charging the battery for a period, after ending the discharging/charging, the voltage would reach an equilibrium state after resting over 1 hour.

Eighth, repeating steps fourth to seventh, except that the discharging current in step fifth is changed to 2 C, 4 C, 6 C, 8 C and 10 C separately each time until all tests finished.

TABLE 16

Ohmic internal resistance values of the lithium-ion battery F

| | Discharging current/C | | | | | |
|---|---|---|---|---|---|---|
| | 1 | 2 | 4 | 6 | 8 | 10 |
| $V_1/V$ | 3.9749 | 3.9087 | 3.7790 | 3.6846 | 3.6038 | 3.5308 |
| $V_2/V$ | 3.9835 | 3.9261 | 3.8132 | 3.7374 | 3.6755 | 3.6221 |
| $(V_2 - V_1)/V$ | 0.0086 | 0.0174 | 0.0342 | 0.0528 | 0.0717 | 0.0913 |
| $R_o/m\Omega$ | 0.860 | 0.870 | 0.855 | 0.880 | 0.896 | 0.913 |

Table 16 shows the ohmic internal resistance (Ro) values of the lithium-ion battery F which are measured and calculated by the method of embodiment 6, wherein the discharging current changes from 1 C to 10 C separately. The ohmic internal resistance Ro is calculated according to a formula Ro=(V2−V1)/I, wherein V1 represents for a voltage value when ending the discharging, and V2 represents for a plateau voltage of the first plateau after the voltage rising from V1.

TABLE 17

Charge-transfer internal resistance values of the lithium-ion battery F

| | discharging current/C | | | | | |
|---|---|---|---|---|---|---|
| | 1 | 2 | 4 | 6 | 8 | 10 |
| $V_2/V$ | 3.9835 | 3.9261 | 3.8132 | 3.7374 | 3.6755 | 3.6221 |
| $V_3/V$ | 4.0173 | 3.9902 | 3.9285 | 3.8858 | 3.8428 | 3.8007 |
| $(V_3 - V_2)/V$ | 0.0338 | 0.0641 | 0.1153 | 0.1484 | 0.1673 | 0.1786 |
| $R_{ct}/m\Omega$ | 3.383 | 3.204 | 2.883 | 2.473 | 2.091 | 1.786 |

Table 17 shows the charge-transfer internal resistance (Rct) values of the lithium-ion battery F measured and calculated by the method described in embodiment 6 when the discharging current changes from 1 C to 10 C separately, wherein the calculation is based on a formula Rct=(V3−V2)/I, and the value points of V3 are determined by a formula |dV/dt|/V<C1, i.e., the points where at certain time a ratio between a voltage change-value relative to time and the voltage at that time is less than a preset value C1. In this embodiment, the value of C1 is 0.05 s$^{-1}$.

Table 18 shows the diffusion internal resistance (Rd) values of the lithium-ion battery F which is measured and calculated by the method described in embodiment 6 when the discharging current changes from 1 C to 10 C separately, wherein the calculation is based on a formula Rd=(V4−V3)/I, and the value points of V4 refers to a voltage value where the voltage reaches stable.

TABLE 18

Diffusion internal resistance values of the lithium-ion battery F

| | discharging current/C | | | | | |
|---|---|---|---|---|---|---|
| | 1 | 2 | 4 | 6 | 8 | 10 |
| $V_3/V$ | 4.0173 | 3.9902 | 3.9285 | 3.8858 | 3.8428 | 3.8007 |
| $V_4/V$ | 4.0330 | 4.0212 | 3.9874 | 3.9657 | 3.9453 | 3.9245 |
| $(V_4 - V_3)/V$ | 0.0157 | 0.0310 | 0.0589 | 0.0799 | 0.1025 | 0.1238 |
| $R_d/m\Omega$ | 1.567 | 1.551 | 1.472 | 1.332 | 1.282 | 1.238 |

The measuring results above show that the method provided in the present disclosure can measure three different polarizations, i.e., the ohmic polarization, the electrochemical polarization and the concentration polarization, and their corresponding internal resistances thereof under permissible discharging/charging current of the battery after a period of discharging/charging. The results also show that both the electrochemical overpotential |V3−V2| and the concentration overpotential |V4−V3| have nonlinear relationship with the current, which mainly reflects in that both the charge-transfer internal resistance and the diffusion internal resistance change with the current. The results further show that the charge-transfer internal resistance measured by EIS method fails to reflect the charge-transfer internal resistance of battery cells under actual working current, which fully reflects the importance and practicability of the present disclosure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for measuring an internal resistance of batteries, the internal resistance comprising an ohmic internal resistance, a charge-transfer internal resistance and a diffusion internal resistance, the method comprising the following steps:
   providing a battery, and controlling a temperature of the battery to a measure temperature;
   discharging/charging the battery under a preset constant-current I for a preset time and then ending the discharging/charging, acquiring voltages of the battery from a time ending the discharging/charging to a time when the voltage reaches stable;
   recording a voltage V1 at the time ending the discharging/charging, a voltage V2 at a time when an ohmic overpotential disappears, a voltage V3 at a time when both the ohmic overpotential and an electrochemical overpotential disappear, and a voltage V4 at a time when all of the ohmic overpotential, the electrochemical overpotential and a concentration overpotential disappear; and
   calculating at least one of the ohmic internal resistance, the charge-transfer internal resistance and the diffusion internal resistance separately based on the preset constant-current I and at least one of necessary voltages selecting from V1, V2, V3 and V4.

2. The method according to claim 1, wherein the ohmic internal resistance Ro is calculated based on a formula Ro=|V2−V1|/I.

3. The method according to claim 1, wherein the charge-transfer internal resistance is calculated based on a formula Rct=|V3−V2|/I.

4. The method according to claim 1, wherein the diffusion internal resistance is calculated based on a formula Rd=|V4−V3|/I.

5. The method according to claim 1, wherein a value of V2 is a plateau voltage at a first plateau after the voltage rising/drop from V1.

6. The method according to claim 1, wherein value points of V3 are determined by a formula |dV/dt|/V<C1 and are the points where a ratio between a voltage change-value relative to time and the voltage at that time is less than a preset value C1.

7. The method according to claim 6, wherein the preset value C1 is between 0.001 s$^{-1}$ to 0.5 s$^{-1}$.

8. The method according to claim 6, wherein the preset value of C1 is between 0.01 s$^{-1}$ to 0.2 s$^{-1}$.

9. The method according to claim 1, wherein V4 is a voltage value where the voltage of the battery reaches stable.

10. The method according to claim 1, wherein an SOC of the battery provided is between 0% and 100%.

11. The method according to claim 1, wherein the preset constant-current I is selected from a scope of 0.1 CA to 30 CA.

12. The method according to claim 1, wherein a time for discharging/charging under the preset constant-current is selected from a scope of 0.01 seconds to 10 hours.

13. The method according to claim 12, wherein the time for discharging/charging under the preset constant-current is selected from a scope of 1 second to 300 seconds.

14. The method according to claim 1, wherein the voltages V1, V2, V3 and V4 are acquired by a high-speed data acquisition system, and a time-step of the high-speed data acquisition system is selected within a scope from 0.1 microsecond to 1 second.

15. The method according to claim 14, wherein the time-step of the high-speed data acquisition system is selected within a scope from 1 microsecond to 1 millisecond.

16. The method according to claim 1, wherein the measure temperature is between −60° C. and 150° C.

17. The method according to claim 1, wherein the measure temperature is between −30° C. and 60° C.

18. The method according to claim 1, wherein said controlling a temperature of the battery to a measure temperature is realized by the following steps: adjusting working environment to a measure temperature, and then placing the battery into the working environment until its temperature being consistent with the measure temperature.

19. The method according to claim 1, wherein the discharging/charging the battery under a preset constant-current I for a preset time is realized by the following: first connecting the battery with a battery tester and a high-speed data acquisition system; after resting under measure temperature without load for 0-2 hours, a voltage of the battery reaching stable; and then discharging/charging under the constant-current I.

20. A method for measuring an internal resistance of batteries, the internal resistance comprising an ohmic internal resistance, a charge-transfer internal resistance and a diffusion internal resistance, the method comprising the following steps:
   providing a battery, and controlling a temperature of the battery to a measure temperature;
   discharging/charging the battery under a preset constant-current I for a preset time and then ending the discharging/charging, acquiring voltages of the battery from a time ending the discharging/charging to a time when the voltage reaches stable;
   recording a voltage V1 at the time ending the discharging/charging, a voltage V2 at a time when an ohmic overpotential disappears, a voltage V3 at a time when both the ohmic overpotential and an electrochemical overpotential disappear, and a voltage V4 at a time when all of the ohmic overpotential, the electrochemical overpotential and a concentration overpotential disappear; and
   calculating at least one of the ohmic internal resistance, the charge-transfer internal resistance and the diffusion internal resistance separately based on the preset constant-current I and at least one of necessary voltages selecting from V1, V2, V3 and V4;
   wherein value points of V3 are determined by a formula |dV/dt|/V<C1 and are the points where a ratio between a voltage change-value relative to time and the voltage at that time is less than a preset value C1.

21. A method for measuring an internal resistance of batteries, the internal resistance comprising an ohmic internal resistance, a charge-transfer internal resistance and a diffusion internal resistance, the method comprising the following steps:
   providing a battery, and controlling a temperature of the battery to a measure temperature;
   discharging/charging the battery under a preset constant-current I for a preset time and then ending the discharging/charging, acquiring voltages of the battery from a time ending the discharging/charging to a time when the voltage reaches stable;

recording a voltage V1 at the time ending the discharging/charging, a voltage V2 at a time when an ohmic overpotential disappears, a voltage V3 at a time when both the ohmic overpotential and an electrochemical overpotential disappear, and a voltage V4 at a time when all of the ohmic overpotential, the electrochemical overpotential and a concentration overpotential disappear; and calculating at least one of the ohmic internal resistance, the charge-transfer internal resistance and the diffusion internal resistance separately based on the preset constant-current I and at least one of necessary voltages selecting from V1, V2, V3 and V4;

wherein V4 is a voltage value where the voltage of the battery reaches stable.

22. A method for measuring an internal resistance of batteries, the internal resistance comprising an ohmic internal resistance, a charge-transfer internal resistance and a diffusion internal resistance, the method comprising the following steps:

providing a battery, and controlling a temperature of the battery to a measure temperature;

discharging/charging the battery under a preset constant-current I for a preset time and then ending the discharging/charging, acquiring voltages of the battery from a time ending the discharging/charging to a time when the voltage reaches stable;

recording a voltage V1 at the time ending the discharging/charging, a voltage V2 at a time when an ohmic overpotential disappears, a voltage V3 at a time when both the ohmic overpotential and an electrochemical overpotential disappear, and a voltage V4 at a time when all of the ohmic overpotential, the electrochemical overpotential and a concentration overpotential disappear; and calculating at least one of the ohmic internal resistance, the charge-transfer internal resistance and the diffusion internal resistance separately based on the preset constant-current I and at least one of necessary voltages selecting from V1, V2, V3 and V4;

wherein the preset constant-current I is selected from a scope of 0.1 CA to 30 CA.

* * * * *